(12) United States Patent
Yu

(10) Patent No.: US 6,353,237 B1
(45) Date of Patent: Mar. 5, 2002

(54) ESD PROTECTION CIRCUIT TRIGGERED BY DIODE

(75) Inventor: Ta-Lee Yu, Hsinchu (TW)

(73) Assignee: Winbond Electronics Corp. (TW)

(*) Notice: Subject to any disclaimer, the term of this patent is extended or adjusted under 35 U.S.C. 154(b) by 0 days.

(21) Appl. No.: 09/365,431

(22) Filed: Aug. 2, 1999

(30) Foreign Application Priority Data

Oct. 22, 1998 (TW) .......................... 87117532 A

(51) Int. Cl.⁷ .............................................. H01L 29/74
(52) U.S. Cl. ...................... 257/173; 257/358; 257/360; 257/361; 257/363
(58) Field of Search .............................. 257/173, 174, 257/357, 358, 359, 360, 361, 363

(56) References Cited

U.S. PATENT DOCUMENTS 5,473,169 A * 12/1995 Ker et al. .................... 257/173
5,663,860 A * 9/1997 Swonger ....................... 361/56
6,172,403 B1 * 1/2001 Chen ........................... 257/355

FOREIGN PATENT DOCUMENTS

| JP | 10-12696 | * 5/1998 |
| JP | 10126962 A | * 5/1998 |

* cited by examiner

Primary Examiner—Nathan Flynn
Assistant Examiner—Ahmed N. Sefer
(74) Attorney, Agent, or Firm—Beyer Weaver & Thomas LLP

(57) ABSTRACT

The present invention provides an ESD protection circuit having at least one semiconductor-controlled rectifier and a diode. The SCR having a floating anode gate is connected between a first circuit node a second circuit node. The diode is connected between an anode and a cathode gate of the SCR to activate the SCR so that a potential between the first circuit node and second circuit node can be clamped at about a holding voltage of the SCR during an ESD event.

5 Claims, 6 Drawing Sheets

ESD PROTECTION CIRCUIT TRIGGERED BY DIODE

BACKGROUND OF THE INVENTION

1. Field of the Invention

The present invention generally relates to an electrostatic discharge protection technique applied to integrated circuitry. More particular, the present invention relates to an electrostatic discharge protection circuit triggered by a diode.

2. Description of the Related Art

Electrostatic discharge, ESD hereinafter, may occur at any time during the phases of testing, assembly, installation, operation, etc., and cause damage to integrated circuits (ICs). Nowadays, the protection of the integrated circuits from ESD damage has become a concern for IC designers. However, sub-micron CMOS ICs have become increasingly vulnerable to ESD damage due to advanced processes, such as the use of lightly-doped drain structures and clad silicide diffusions. Conventionally, lateral semiconductor-controlled rectifiers (LSCRs), for example, disclosed in U.S. Pat. No. 5,012,317, have been employed as ESD protection circuits for shunting ESD stress. A cross-sectional view of the conventional LSCR is illustrated in FIG. 1.

Referring to FIG. 1, the LSCR is fabricated onto a P-type semiconductor substrate 10, for example a silicon substrate, in a predetermined portion of which an N-well region 11 is formed. A P-type doped region 12 and an N-type doped region 13 are formed within the extent of the N-well region 11 and spaced apart from each other. An N-type doped region 14 and a P-type doped region 15 are formed within the extent of the P-type semiconductor substrate 10 and spaced apart from each other, where the M-type doped region 14 is closer to the N-well region 11 than the P-type doped region 15.

In the drawing, the P-type doped region 12 and the N-type doped region 13 are together connected to an IC pad 1. The IC pad 1 is an input pad, output pad, I/O pad or power pad for an internal circuit 2, which is vulnerable to ESD damage and should be protected by the LSCR. In addition, the N-type doped region 14 and the P-type doped region 15 are together connected to a power node $V_{ss}$. Generally, the power node is connected to a ground under normal operation.

Correspondingly, the P-type doped region 12, the N-well region 11, and the P-type semiconductor substrate 10 serve as the emitter, base, and collector, respectively, of a PNP bipolar junction transistor 20. The N-well region 11, the P-type semiconductor substrate 10, and the N-type doped region 14 serve as the collector, base, and emitter, respectively, of an NPN bipolar junction transistor 21. Referring to FIG. 2, the equivalent circuit diagram of the conventional LSCR as shown in FIG. 1 is schematically illustrated. In the drawing, resistors 22 and 23 designate the respective spreading resistance of the N-well region 11 and the P-type semiconductor substrate 10.

However, the triggering of the conventional SCR to activate and thus bypass the ESD stress relies heavily on the P/N junction breakdown between the semiconductor substrate 10 and the N-well region 11. Due to the fact that both the substrate and well region are generally doped or implanted with a low doping concentration, the trigger voltage of the LSCR can be up to 30V or more, at which point the ICs may have been adversely affected. Particularly, the LSCR is more reluctant to be triggered when applied to epi-wafer processes.

SUMMARY OF THE INVENTION

Therefore, it is an object of the present invention to provide an ESD protection circuit having a semiconductor-controlled rectifier with a floating anode gate. The semiconductor-controlled rectifier can be triggered by means of a diode at a reduced trigger voltage.

It is another object of the present invention to provide an ESD protection circuit having a semiconductor-controlled rectifier with a floating anode gate. The semiconductor-controlled rectifier can clamp the potential of a circuit node to be protected at a low holding voltage.

To achieve the aforementioned objects, the present invention provides an ESD protection circuit having at least one semiconductor-controlled rectifier and a diode. The SCR having a floating anode gate is connected between a first circuit node and a second circuit node. The diode is connected between an anode and a cathode gate of the SCR to activate the SCR so that a potential between the first circuit node and second circuit node can be clamped at about a holding voltage of the SCR during an ESD event.

Accordingly, the trigger voltage of the ESD protection circuit can be reduced to about the breakdown voltage of the diode. Moreover, due to the fact that the semiconductor-controlled rectifier has its anode gate floating, the holding voltage can be further reduced. Therefore, the potential between two circuit nodes can be soon clamped to a quite low holding voltage during an ESD event. Thus, the ESD protection circuit of the present invention has a low trigger voltage as well as a low holding voltage, and can therefore efficiently protect an internal circuit from ESD damage, especially in deep sub-micron process applications.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

First Embodiment

Figure 1:
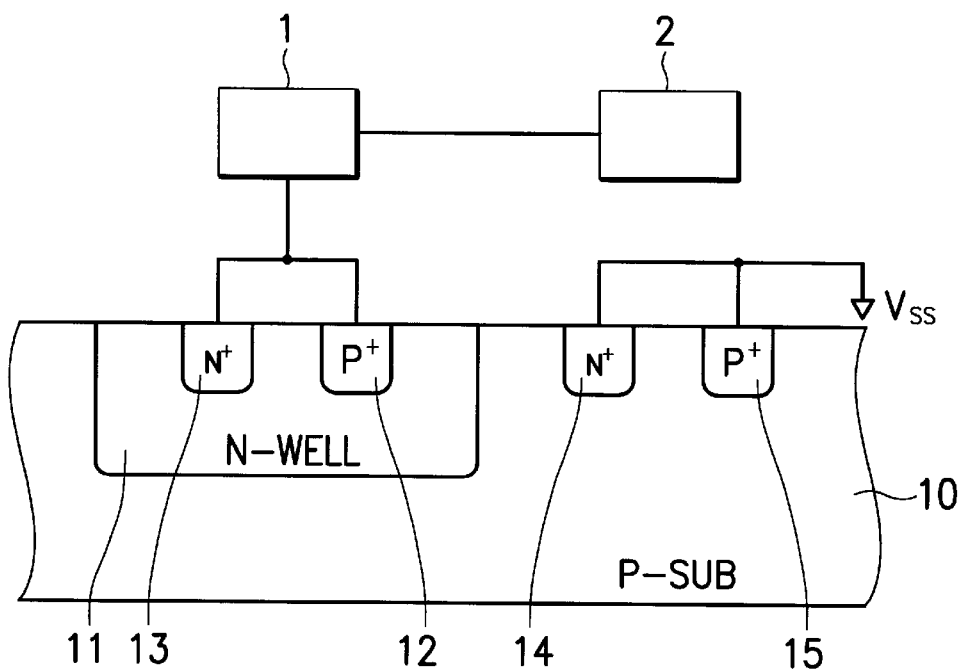
FIG. 1 schematically depicts a conventional LSCR fabricated onto a semiconductor substrate in a cross-sectional view.
Figure 2:
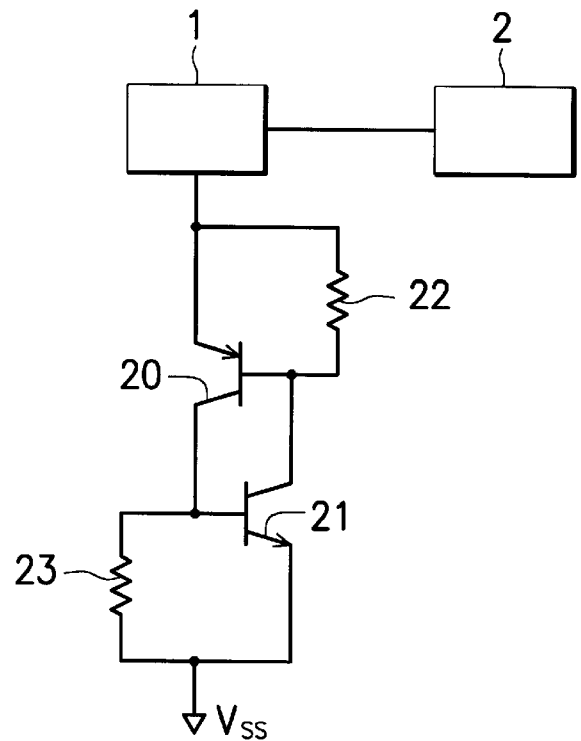
FIG. 2 schematically depicts the equivalent circuit diagram of the conventional LSCR as shown in FIG. 1.
Figure 3:
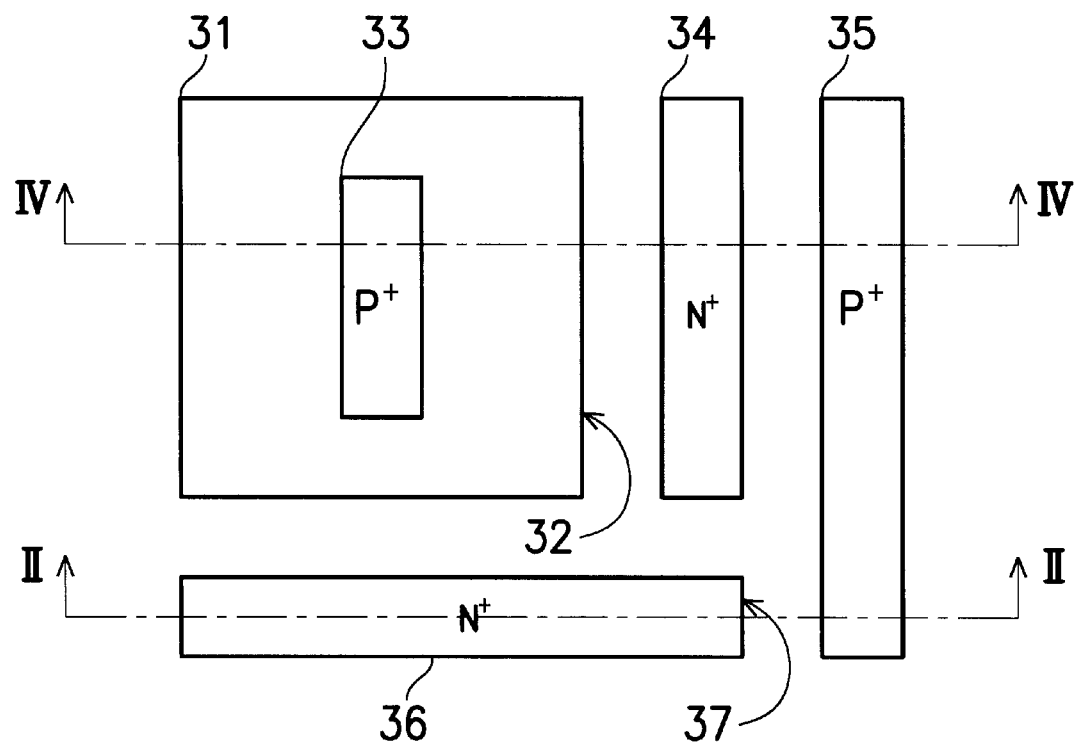
FIG. 3 schematically depicts a top view of the layout diagram of a ESD protection circuit fabricated onto a semiconductor substrate according to one preferred embodiment of the present invention.

Referring to FIG. 3, the layout diagram of a ESD protection circuit fabricated onto a semiconductor substrate in accordance with one preferred embodiment of the present invention is schematically depicted from a top view. In FIG. 3, reference numeral 30 stands for a P-type semiconductor layer and reference numeral 31 stands for an N-type semiconductor layer, wherein the P-type semiconductor layer 30 contacts the N-type semiconductor layer 31 with a junction 32 therebetween. In this embodiment, a P-type semiconductor substrate is exemplified as the P-type semiconductor layer 30, while the N-type semiconductor layer 31 can be an N-well formed in the extent of the P-type semiconductor substrate. However, the embodiment illustrated in FIG. 3 is one of many feasible embodiments, and not intended to limit the scope of the present invention thereto. For example, a pair of adjacent well regions formed in a semiconductor substrate can also implement the P-type semiconductor layer 30 and the N-type semiconductor layer 31.

In the drawing, a first P-type doped region 33 is formed in the extent of the N-type semiconductor layer 31. A first N-type doped region 34 and a second P-type doped region 35 are formed in the extent of the P-type semiconductor layer 30 and spaced apart from each other. Usually, the first N-type doped region 34 is closer to the junction 32 than the second P-type doped region 35. Preferably, the first P-type doped region 33, first N-type doped region 34, and second P-type doped region 35 are laid out in the shape of strips and arranged in parallel. The cross-sectional view of FIG. 3 taken along the line IV—IV is illustrated in FIG. 4.

Moreover, a second N-type doped region 36 is laid out in the shape of a strip and formed in the P-type semiconductor layer 30 so as to establish a junction 37 therebetween. In FIG. 3, the first N-type doped region 34 has its longitudinal direction substantially perpendicular to that of the second N-type doped region 36. The cross-sectional view of FIG. 3 taken along the line II—II is illustrated in FIG. 5.

Figure 4:
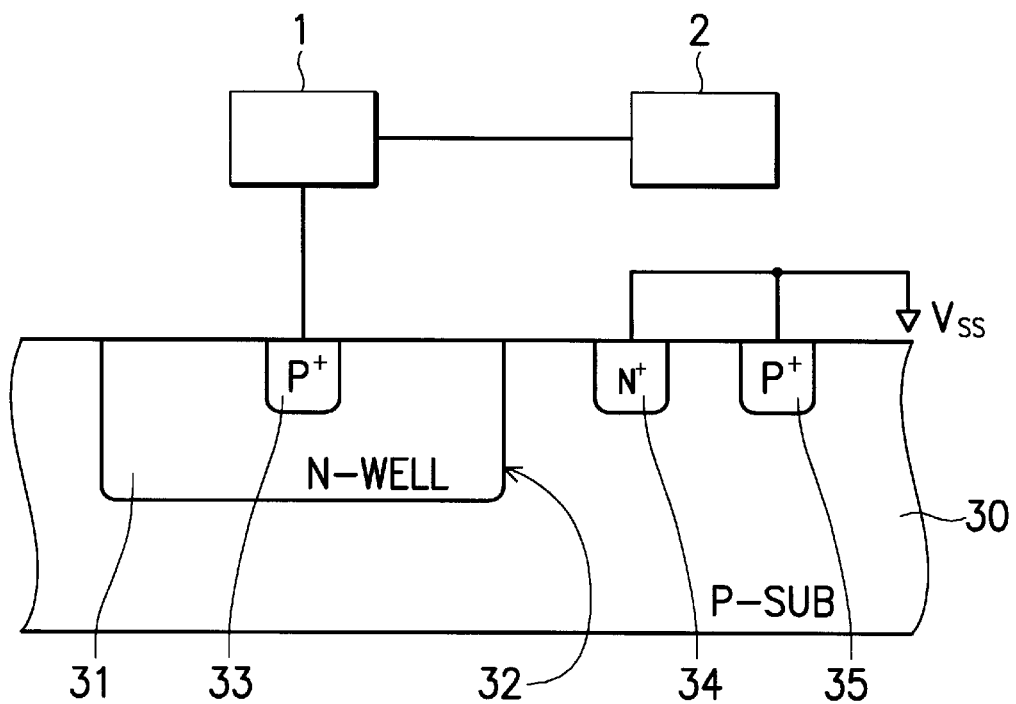
FIG. 4 depicts a cross-sectional view of FIG. 3 taken along a line IV—IV.
Figure 5:
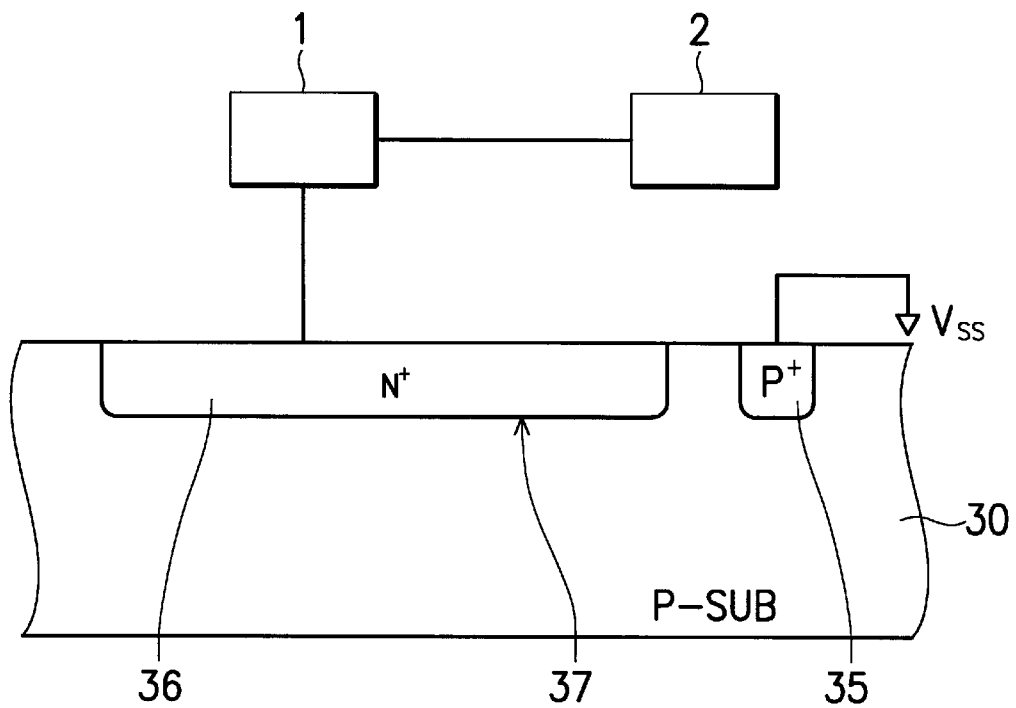
FIG. 5 depicts a cross-sectional view of FIG. 3 taken along a line V—V.

As shown in FIGS. 4 and 5, the first P-type doped region 33 and the second N-type doped region 36 are together connected to an IC pad 1. The IC pad 1 is an input pad, output pad, I/O pad or power pad for an internal circuit 2. The ESD protection circuit in accordance with the present invention is utilized to protect the internal circuit 2 from ESD damage. In addition, the first N-type doped region 34 and the second P-type doped region 35 are together connected to a power node, for example $V_{SS}$. Generally, the power node $V_{SS}$ is connected to a ground under normal operation.

Figure 6:
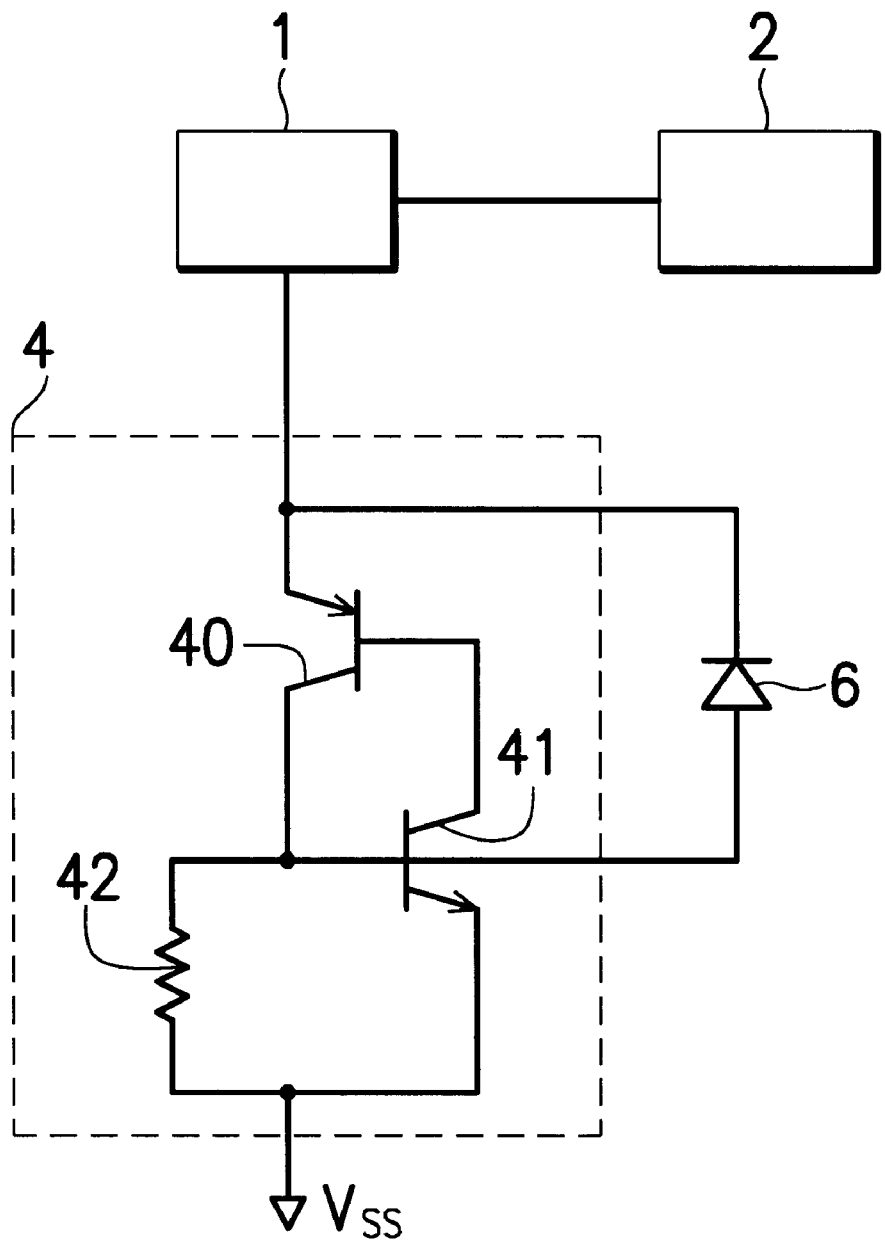
FIG. 6 schematically depicts the equivalent circuit diagram of the ESD protection circuit as shown in FIG. 3.

Referring to FIG. 6, the equivalent circuit diagram of the ESD protection circuit as shown in FIG. 3 is schematically depicted. The first P-type doped region 33, the N-type semiconductor layer 31, and the P-type semiconductor layer 30 serve as the emitter, base, and collector, respectively, of a PNP bipolar junction transistor 40. The N-type semiconductor layer 31, the P-type semiconductor layer 30, and the first N-type doped region 34 serve as the collector, base, and emitter, respectively, of an NPN bipolar junction transistor 41. The PNP bipolar junction transistor 40 and the NPN bipolar junction transistor 41 constitute a semiconductor-controlled rectifier, SCR hereinafter, 4. According to the present invention, there is no ohmic contact within the N-type semiconductor layer 31, so the SCR 4 has a floating anode gate in view of the circuit diagram. Because the second P-type doped region 35 serves as an ohmic contact of the P-type semiconductor layer 30, the SCR 4 has its cathode gate connected to the $V_{SS}$ power node (the cathode of the SCR 4) by a resistor 42. Note that the resistor 42 designates the spreading resistance of the P-type semiconductor layer 30. However, the SCR 4 is provided with its anode connected to the IC pad 1. Moreover, the second N-type doped region 36 and the P-type semiconductor layer 30 serve as the cathode and anode of a diode 6.

The operation of the ESD protection circuit of the present invention will be described in view of FIGS. 3–6 as follows.

When ESD stress positive to the $V_{SS}$ power node occurs at the IC pad 1, the junction 37 between the second N-type doped region 36 and the P-type semiconductor layer 30 enters breakdown; that is, the diode 6 breaks down first, so as to conduct a current flowing from the P-type semiconductor layer 30 to the second P-type doped region 35 through the resistor 42. Then, the breakdown current turns on the NPN transistor 41 and thus triggers the SCR 4. Since the SCR 4 is triggered and snaps back, the potential between the IC pad 1 and the $V_{SS}$ power node can be clamped at the holding voltage of the SCR 4.

Accordingly, the trigger voltage of the ESD protection circuit in accordance with the present invention is almost equal to the breakdown voltage of the diode 6, e.g., in the range of about 7~10V for 0.35 $\mu$m process. Moreover, due to the fact that the SCR 4 has its anode gate floating, the holding voltage can be further reduced to the range of about 1~3V. Therefore, the potential between the IC pad 1 and the $V_{SS}$ power node can be soon clamped to quite a low holding voltage during an ESD event. Thus, the ESD protection circuit of the present invention with a low trigger voltage as well as a low holding voltage can efficiently protect the internal circuit 2 from ESD damage, especially in deep sub-micron process applications.

Alternatively, when ESD stress negative to $V_{SS}$ occurs to the IC pad 1 and forward biases the diode 6, the potential of the IC pad 1 can also be clamped to the turn-on voltage of the diode 6 and efficiently protect the internal circuit 2 from ESD damage.

Second Embodiment

Figure 7:
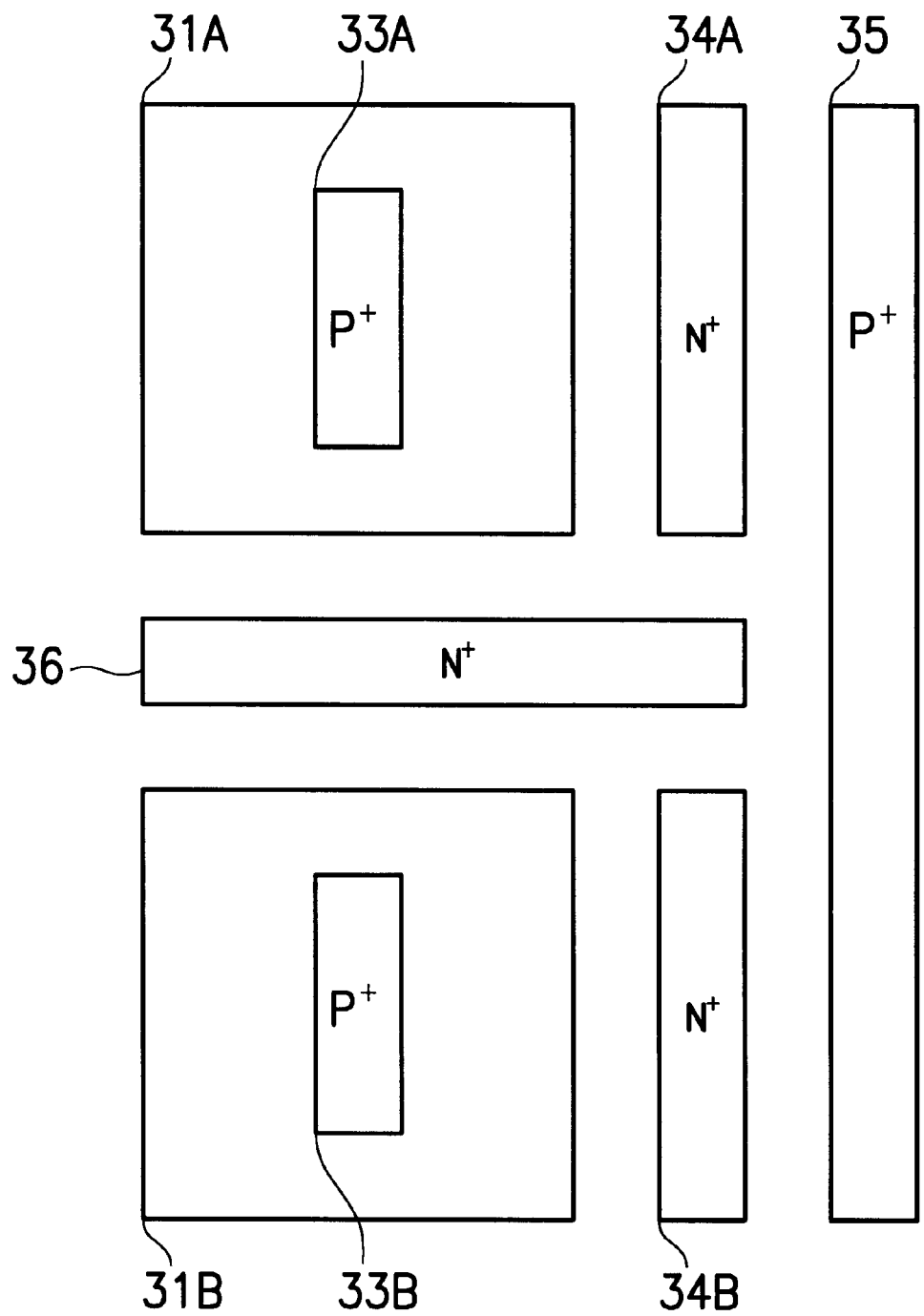
FIG. 7 schematically depicts a top view of the layout diagram of a ESD protection circuit fabricated onto a semiconductor substrate according to another preferred embodiment of the present invention.
Figure 8:
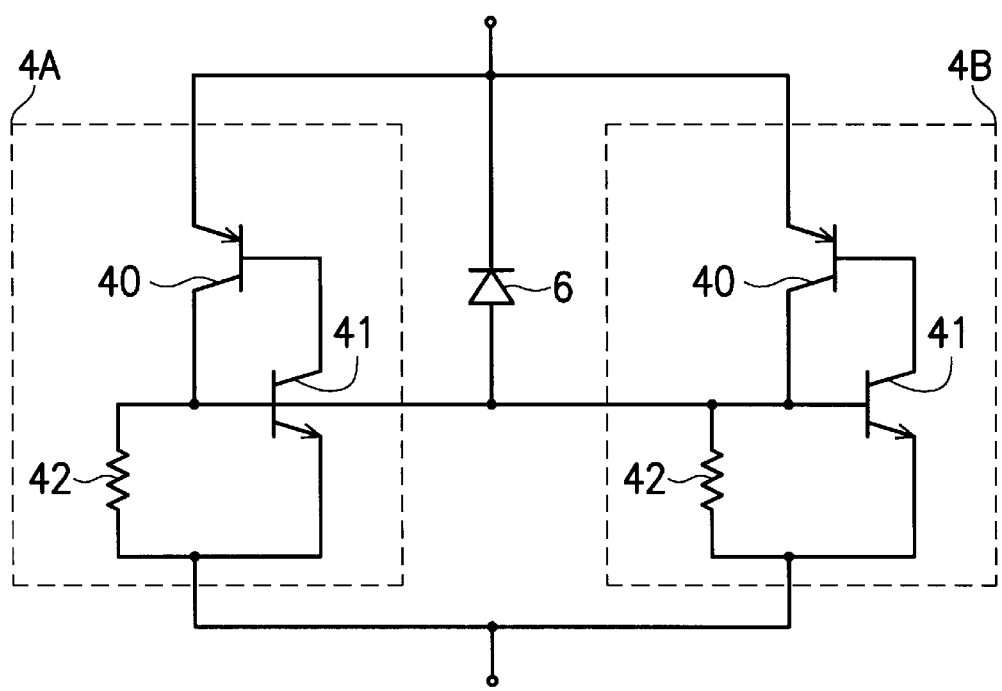
FIG. 8 schematically depicts the equivalent circuit diagram of the ESD protection circuit as shown in FIG. 7.

Referring to FIG. 7, the layout diagram of a ESD protection circuit fabricated onto a semiconductor substrate in accordance with another preferred embodiment of the present invention is schematically depicted from a top view. In this embodiment, the N-type semiconductor layer 31 is divided into a pair of N-type regions 31A and 31B, the first P-type doped region 33 into a pair of P-type doped regions 33A and 33B, and the first N-type doped region 34 into a pair of N-type doped regions 34A and 34B in symmetry with the second N-type doped region 36. The equivalent circuit diagram of the ESD protection circuit as shown in FIG. 7 is schematically depicted in FIG. 8, wherein a pair of SCRs 4A and 4B are connected in parallel and are symmetric to the diode 6.

In this embodiment, two symmetrical SCRs 4A and 4B are provided to uniformly bypass the ESD discharge current and prevent the discharge current from localization. In the same way, a greater number of SCRs connected in parallel in conjunction with the diode 6 can also provide ESD protection.

In addition, the ESD protection circuit can be applied to any two circuit nodes, such as between power rails $V_{DD}$–$V_{SS}$ or between an IC pad and a $V_{DD}$ power node, as well.

In conclusion, the ESD protection circuit of the present invention comprises the SCR to be triggered by the diode so that the trigger voltage can be reduced to the breakdown voltage of the diode. The SCR with the floating anode gate can clamp the potential between two circuit nodes to be protected at low holding voltage after the SCR has been triggered and snaps back. Moreover, a plurality of SCRs can be provided to prevent the ESD discharge current from localization and thus bypass the ESD current uniformly. Accordingly, the present invention can efficiently protect the internal circuit from ESD damage, especially in deep submicron process applications.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An ESD protection circuit, comprising:

an SCR connected between a first circuit node and a second circuit node, said SCR having a floating anode gate that is formed of a floating type N-type semiconductor layer;

a diode connected between an anode that is a first P-type doped region formed in said N-type semiconductor layer and a cathode gate of said SCR that is a P-type semiconductor layer in contact with said N-type semiconductor layer to establish a junction therebetween to activate said SCR so that a potential between said first circuit node and second circuit node can be clamped at about a holding voltage of said SCR during an ESD event, wherein said diode has a cathode and an anode connected to the anode and cathode gate of said SCR; and an ohmic contact region formed in said P-type semiconductor layer; wherein said SCR has a cathode being a first N-type doped region formed in said P-type semiconductor layer, and wherein said cathode of said diode is a second N-type doped region formed in said P-type semiconductor layer.

2. An ESD protection circuit, comprising:

a semiconductor substrate of a first conductivity type;

a floating well of a second conductivity type formed in said semiconductor substrate;

a first doped region of the first conductivity type formed in said well and connected to a first circuit node;

a second doped region of the second conductivity type formed in said semiconductor substrate and connected to a second circuit node, wherein said first doped region, said well, said semiconductor substrate and said second doped region constitute a rectifier; and a third doped region of the second conductivity type formed in said semiconductor substrate;

wherein a junction between said third doped region and said semiconductor substrate enters breakdown to trigger said rectifier and clamp a potential between said first circuit node and said second circuit node at about a holding voltage of said rectifier.

3. The ESD protection circuit as claimed in claim 2, further comprising a fourth doped region of the first conductivity type formed in said semiconductor substrate and electrically connected to said second circuit node.

4. The ESD protection circuit as claimed in claim 3, wherein the first conductivity type is P-type and the second conductivity type is N-type.

5. The ESD protection circuit as claimed in claim 3, wherein the first conductivity type is N-type and the second conductivity type is P-type.

* * * * *